(12) United States Patent
Fratin et al.

(10) Patent No.: US 12,236,999 B2
(45) Date of Patent: Feb. 25, 2025

(54) DECODER ARCHITECTURES FOR THREE-DIMENSIONAL MEMORY DEVICES

(71) Applicant: Micron Technology, Inc., Boise, ID (US)

(72) Inventors: Lorenzo Fratin, Buccinasco (IT); Fabio Pellizzer, Boise, ID (US); Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 229 days.

(21) Appl. No.: 17/830,042

(22) Filed: Jun. 1, 2022

(65) Prior Publication Data

US 2023/0395128 A1 Dec. 7, 2023

(51) Int. Cl.
| | |
|---|---|
| *G11C 11/40* | (2006.01) |
| *G11C 5/06* | (2006.01) |
| *G11C 11/4074* | (2006.01) |
| *G11C 11/408* | (2006.01) |
| *G11C 11/4094* | (2006.01) |

(52) U.S. Cl.
CPC .......... *G11C 11/4087* (2013.01); *G11C 5/063* (2013.01); *G11C 11/4074* (2013.01); *G11C 11/4085* (2013.01); *G11C 11/4094* (2013.01)

(58) Field of Classification Search
CPC ... G11C 11/4087; G11C 11/4094; G11C 8/10; G11C 13/0026; G11C 13/0028; G11C 5/025; H10B 63/34
See application file for complete search history.

(56) References Cited

U.S. PATENT DOCUMENTS

| | | | |
|---|---|---|---|
| 10,784,312 B1* | 9/2020 | Kabuyanagi | G11C 13/003 |
| 2011/0221474 A1* | 9/2011 | Troccoli | G11C 8/10 |
| | | | 326/105 |
| 2022/0068954 A1* | 3/2022 | Kim | H01L 23/5226 |

* cited by examiner

*Primary Examiner* — Uyen Smet
(74) *Attorney, Agent, or Firm* — Holland & Hart LLP

(57) ABSTRACT

Methods, systems, and devices for decoder architectures for three-dimensional memory devices are described. In some cases, a decoder for a memory device may include two portions. A first portion of the decoder may be manufactured on top of the memory array, and may include a pillar decoding portion to selectively bias a first array of decoding elements coupled with conductive pillars of the memory array and a word line decoding portion to selectively bias a second array of decoding elements coupled with word lines of the memory array. A second portion of the decoder may be implemented in a separate semiconductor device which may include a set of logic circuits configured to drive signal to a set of contacts bonded to contacts of the first portion to drive the digit lines, voltage sources, and gate lines.

25 Claims, 7 Drawing Sheets

SECTION A-A

DECODER ARCHITECTURES FOR THREE-DIMENSIONAL MEMORY DEVICES

FIELD OF TECHNOLOGY

The following relates to one or more systems for memory, including decoder architectures for three-dimensional memory devices.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
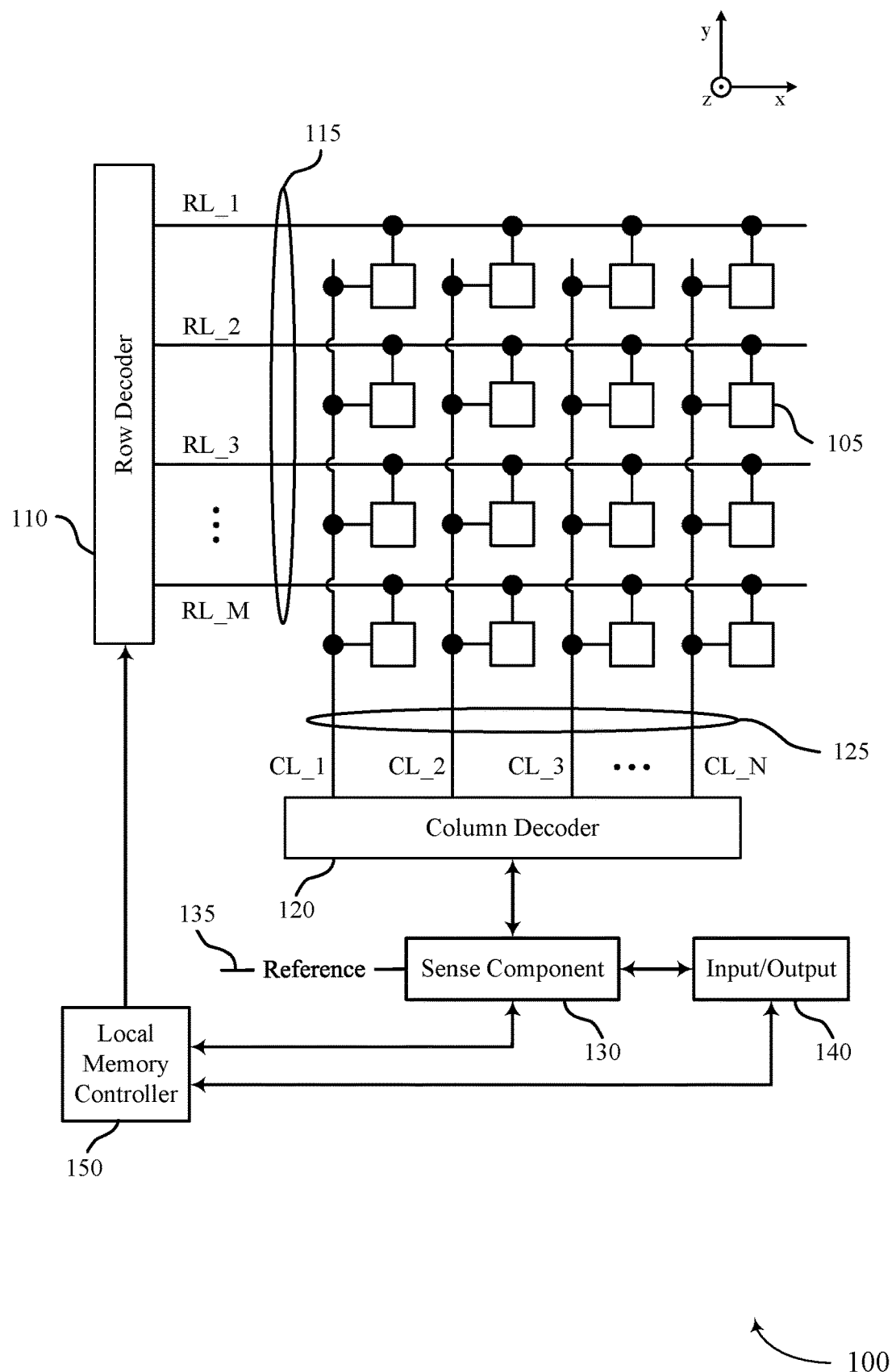
FIG. 1 illustrates an example of a memory array that supports decoder architectures for three-dimensional memory devices in accordance with examples as disclosed herein.

Some memory devices may include a decoder coupled with the memory array. In some cases, the decoder be operable to bias access lines of the memory array as part of accessing memory cells of the memory array. For example, the memory array may be an example of a three-dimensional memory array having a vertical stack of word line plates and a set of digit lines coupled with conductive pillars extending vertically through the stack of word line plates, with memory cells at intersections of conductive pillars and word line plates. To access a memory cell, the memory device may include a decoder operable to drive signals to a selected word line plate and a selected conductive pillar using a set of transistors. The selected word line plate may be selectively coupled by the decoder with a voltage source operable to provide a signal. Similarly, the selected conductive pillar may be selectively coupled with a digit line, which may be used to convey signals to and from a sensing circuit (e.g., sense amplifier). In some cases, each word line plate may include a quantity of isolated sections that can be independently addressed by the decoder using a dedicated transistor for each section, which may reduce undesirable capacitance (e.g., parasitic capacitance) resulting from the word line plate. However, using a dedicated transistor for each section of a word line plate may result in a large quantity of transistors, which may increase complexity of decoding the word lines and the conductive pillars. Accordingly, techniques to efficiently decode word lines and conductive pillars are desired.

As described herein, a decoder for a memory device may include two portions. A first portion of the decoder may be manufactured on a same substrate as (e.g., under, on top of) a memory array, and may include a pillar decoding portion and a word line decoding portion. The pillar decoding portion may include a first array of decoding elements (e.g., transistors, such as vertical transistors or thin-film transistors (TFTs)) which couple a respective conductive pillar with a digit line extending in a first horizontal direction, while the word line decoding portion may include a second array of decoding elements which couple a respective word line portion with a voltage source extending in the first horizontal direction. The pillar decoding portion and the word line decoding portion may further include a set of gate lines extending in a second horizontal direction and configured to activate a column of decoding elements. A second portion of the decoder may be implemented in a separate semiconductor device (e.g., a separate substrate) which may include a set of logic circuits configured to drive signal to a set of contacts, such as a complementary metal-oxide semiconductor (CMOS) circuits. In some cases, the contacts of the second portion may be bonded to contacts of the first portion to drive the digit lines, voltage sources, and gate lines (e.g., using hybrid bonding). Due to the array structure of the first portion, a single decoding element of the array may be selected and driven by driving a first signal through a first contact to activate a column of decoding elements which includes the selected decoding element and driving a second signal through a second contact to bias a voltage source or digit line coupled with the selected decoding element. Accordingly, word line portions and conductive pillars may be decoded using a smaller quantity of contacts relative to the quantity of decoding elements.

Features of the disclosure are initially described in the context of memory devices and arrays with reference to FIGS. 1, 2, 3A, and 3B. Features of the disclosure are described in the context of systems with reference to FIGS. 4 through 6. These and other features of the disclosure are further illustrated by and described with reference to an apparatus diagram and flowcharts that relate to decoder architectures for three-dimensional memory devices as described with reference to FIG. 7.

FIG. 1 illustrates an example of a memory device 100 that supports decoder architectures for three-dimensional memory devices in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

In some cases, a decoder for a memory device 100 may include two portions. A first portion of the decoder may be manufactured on top of a memory array, and may include a pillar decoding portion (e.g., a column decoder 120) and a word line decoding portion (e.g., a row decoder 110). The pillar decoding portion may include a first array of decoding elements (e.g., transistors, such as vertical transistors or thin-film transistors (TFTs)) which couple a respective conductive pillar with a digit line (e.g., a column line 125) extending in a first horizontal direction, while the word line decoding portion may include a second array of decoding elements which couple a respective word line portion (e.g., a row line 115) with a voltage source extending in the first horizontal direction. The pillar decoding portion and the word line decoding portion may further include a set of gate lines extending in a second horizontal direction and configured to activate a column of decoding elements. A second portion of the decoder may be implemented in a separate semiconductor device which may include a set of logic circuits configured to drive signal to a set of contacts, such as a complimentary metal-oxide semiconductor (CMOS). In some cases, the contacts of the second portion may be bonded to contacts of the first portion to drive the digit lines, voltage sources, and gate lines (e.g., using hybrid bonding). Due to the array structure of the first portion, a single decoding element of the array may be selected and driven by driving a first signal through a first contact to activate a column of decoding elements which includes the selected decoding element and driving a second signal through a second contact to bias a voltage source or digit line coupled with the selected decoding element. Accordingly, word line portions and conductive pillars may be decoded using a smaller quantity of contacts relative to the quantity of decoding elements.

The memory device 100 may include any quantity of non-transitory computer readable media that support decoder architectures for three-dimensional memory devices. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 2:
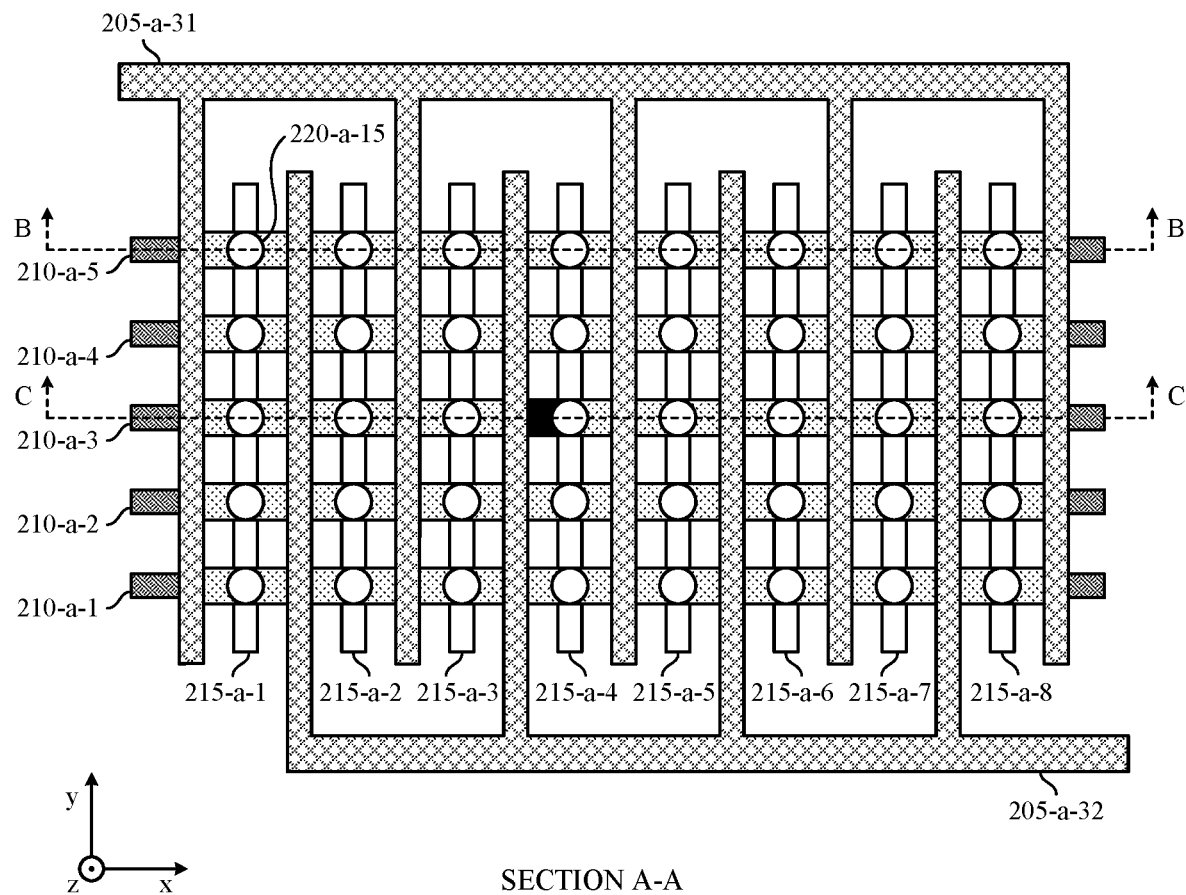
FIG. 2 illustrates a top view of an example of a memory array that supports decoder architectures for three-dimensional memory devices in accordance with examples as disclosed herein.
Figure 3A:
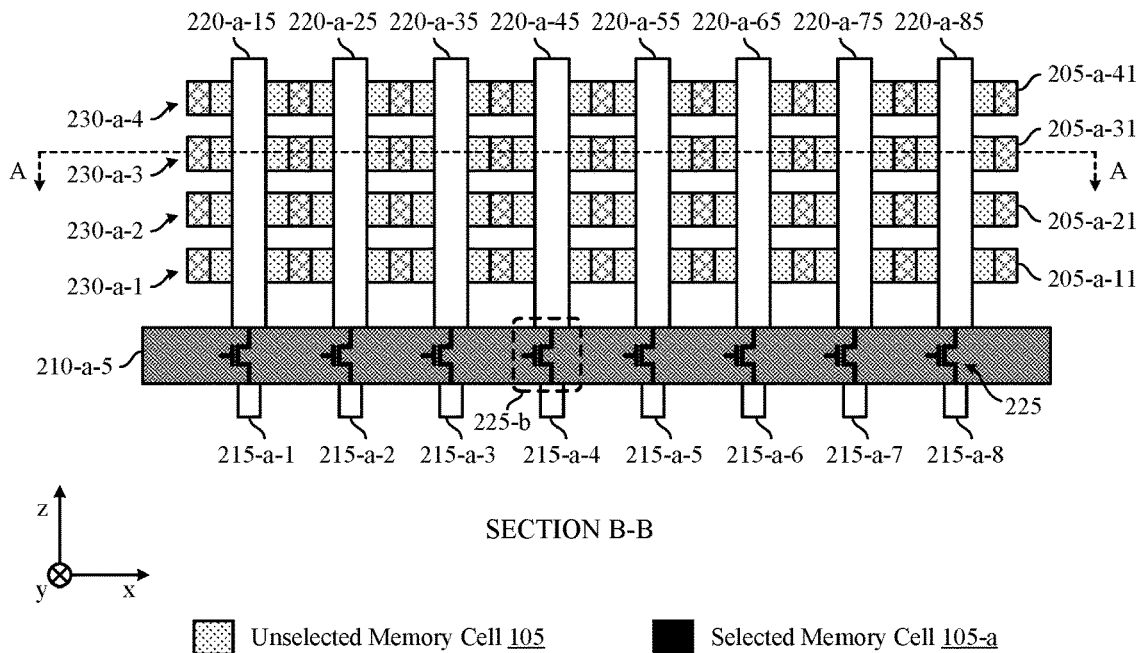
FIGS. 3A and 3B illustrate side views of an example of a memory array that supports decoder architectures for three-dimensional memory devices in accordance with examples as disclosed herein.
Figure 3B:
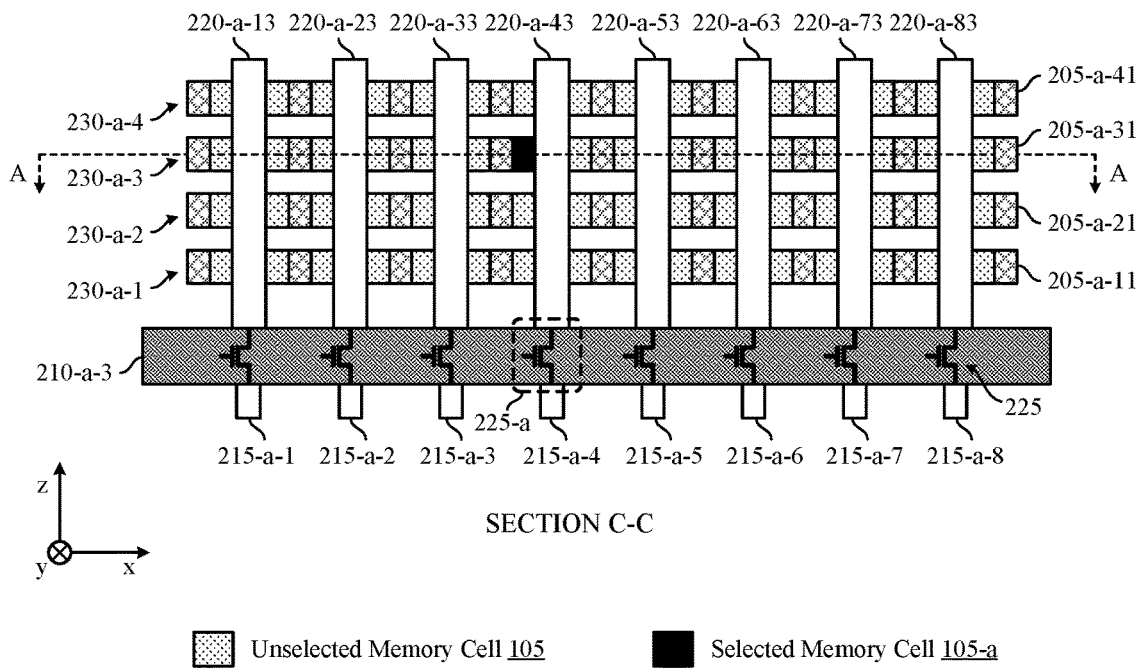

FIGS. 2, 3A, and 3B illustrate an example of a memory array 200 that supports decoder architectures for three-dimensional memory devices in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C)

of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, tiers, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-a-n1 and even word lines 205-a-n2 for a given level, n), where such word lines 205 of the same level 230 may be described as being interleaved (e.g., with portions of an odd word line 205-a-n1 projecting along the y-direction between portions of an even word line 205-a-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line (e.g., a conductive pillar portion) that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-a of the level 230-a-3 may be accessed according to an intersection between the pillar 220-a-43 and the word line 205-a-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-a, a corresponding access bias (e.g., the first voltage) may be applied to the word line 205-a-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a sense line 215 (e.g., a digit line, a column line, an access line extending along the y-direction) via a respective transistor 225 coupled between (e.g., physically, electrically) the pillar 220 and the sense line 215. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected sense line 215, or a combination thereof may be an example of a selected column line 125 described with reference to FIG. 1 (e.g., a bit line).

The transistors 225 (e.g., a channel portion of the transistors 225) may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillars 220, or sense lines 215, or various combinations thereof, may be supported by a column decoder 120, or a sense component 130, or both.

To apply the corresponding access bias (e.g., $-V_{access}/2$) to the pillar 220-a-43, the sense line 215-a-4 may be biased with the access bias, and the gate line 210-a-3 may be grounded (e.g., biased to 0V) or otherwise biased with an activation voltage. In an example where the transistors 225 are n-type transistors, the gate line 210-*a*-3 being biased with a voltage that is relatively higher than the sense line 215-*a*-4 may activate the transistor 225-*a* (e.g., cause the transistor 225-*a* to operate in a conducting state), thereby coupling the pillar 220-*a*-43 with the sense line 215-*a*-4 and biasing the pillar 220-*a*-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-*a* is activated, or may be coupled with another voltage source (e.g., grounded, via a high-resistance path, via a leakage path) to avoid a voltage drift of the pillars 220. For example, a ground voltage being applied to the gate line 210-*a*-3 may not activate other transistors coupled with the gate line 210-*a*-3, because the ground voltage of the gate line 210-*a*-3 may not be greater than the voltage of the other sense lines 215 (e.g., which may be biased with a ground voltage or may be floating). Further, other unselected gate lines 210, including gate line 210-*a*-5 as shown in FIG. 3A, may be biased with a voltage equal to or similar to an access bias (e.g., $-V_{access}/2$, or some other negative bias or bias relatively near the access bias voltage), such that transistors 225 along an unselected gate line 210 are not activated. Thus, the transistor 225-*b* coupled with the gate line 210-*a*-5 may be deactivated (e.g., operating in a non-conductive state), thereby isolating the voltage of the sense line 215-*a*-4 from the pillar 220-*a*-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

In some cases, a decoder for a memory device including a memory array 200 may include two portions. A first portion of the decoder may be manufactured as part of a same substrate as (e.g., below, on top of) the memory array 200, and may include a pillar decoding portion to selectively bias conductive pillars 220 and a word line decoding portion to selectively bias word lines 205. The pillar decoding portion may include a first array of decoding elements (e.g., transistors, such as vertical transistors or TFTs) which couple a respective conductive pillar 220 with a digit line (e.g., a sense line 215) extending in a first horizontal direction, while the word line decoding portion may include a second array of decoding elements which couple a respective word line 205 with a voltage source extending in the first horizontal direction. The pillar decoding portion and the word line decoding portion may further include a set of gate lines 210 extending in a second horizontal direction and configured to activate a column of decoding elements. A second portion of the decoder may be implemented in a separate semiconductor device (e.g., a separate substrate) which may include a set of logic circuits configured to drive signal to a set of contacts, such as a CMOS circuits. In some cases, the contacts of the second portion may be bonded to contacts of the first portion to drive the digit lines, voltage sources, and gate lines 210 (e.g., using hybrid bonding). Due to the array structure of the first portion, a single decoding element for the array may be activated by driving a first signal through a first contact. The decoding element may bias a selected word line portions or digit line via a voltage source or other driver coupled to the decoding element via a second contact. Accordingly, word line portions and conductive pillars may be decoded using a smaller quantity of contacts relative to the quantity of decoding elements.

Figure 4:
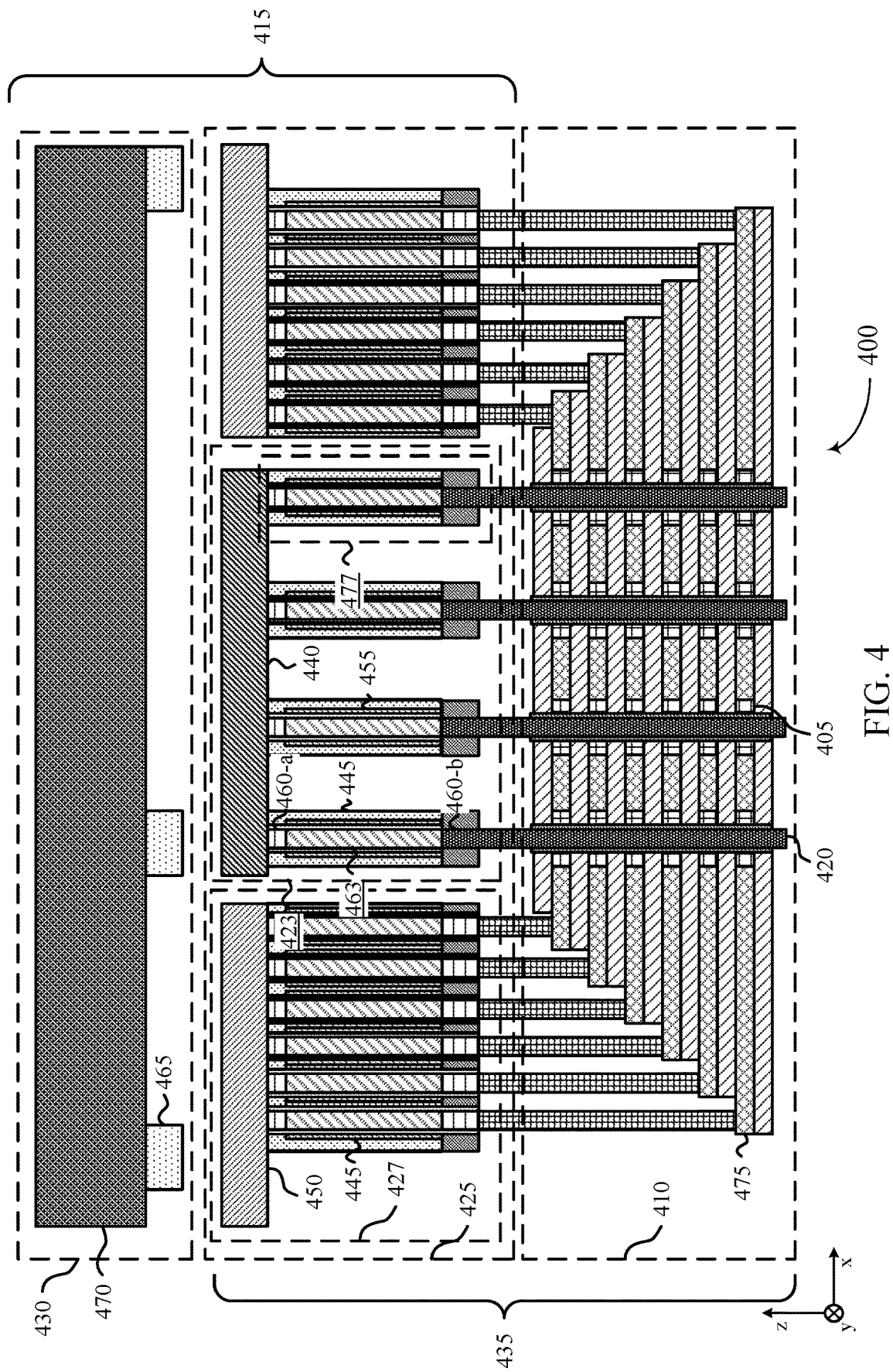
FIG. 4 illustrates an example of a system that supports decoder architectures for three-dimensional memory devices in accordance with examples as disclosed herein.

FIG. 4 illustrates an example of a system 400 that supports decoder architectures for three-dimensional memory devices in accordance with examples as disclosed herein. The system 400 may include a memory array 410 and a decoder 415 configured to bias the memory array 410 as part of an access operation to access a memory cell 405. In some cases, the memory array 410 and the decoder 415 may be examples of the corresponding devices as described with reference to FIGS. 1 through 3B.

For example, the decoder 415 may include a row decoder (e.g., a row decoder 110) configured to decode word line plates 475 and a column decoder (e.g., a column decoder 120) configured to bias conductive pillars 420 (e.g., conductive pillars 220). The conductive pillars 420 may extend vertically (e.g., in the z-direction) through the memory array 410 and may couple with one or more digit lines 440 using a transistor 445. The word line plates 475 may be examples of word lines 205 as described with reference to FIGS. 2 through, and may be arranged in multiple levels extending vertically (e.g., multiple levels or tiers stacked vertically), each level including a pair of interleaved comb structures. Each comb structure may include a respective set of word line members extending horizontally (e.g., in the y-direction) through the memory array 410 and may be configured to apply a voltage to a memory cell 405. For example, the decoder 415 may include one or more conductive lines 450 selectively coupled with word line plates 475 using one or more transistors 445.

The decoder 415 may be implemented using two portions. For example, the decoder 415 may include a first portion 425 and a second portion 430. The first portion 425 may include a set of digit lines 440 extending horizontally in the x-direction (e.g., substantially orthogonal to the word line members) and a set of conductive lines 450 extending horizontally in the x-direction.

The first portion 425 may include a first set of decoding elements 423, each decoding element 477 of the first set coupling a respective conductive pillar 420 with a digit line 440. The first portion 425 may also include a second set of decoding elements 427, each decoding element 477 of the second set coupling a respective word line plate 475 (e.g., a word line comb) with a conductive line 450. The first set of decoding elements 423 and the second set of decoding elements 427 may be arranged in a grid formation, which may include one or more rows of decoding elements 477 extending in the x-direction (e.g., along the word line member direction) and one or more columns of decoding elements 477 extending in the y-direction (e.g., along the digit line direction). Additionally, the first portion 425 may include one or more gate lines 455 extending in the y-direction and each configured to activate a row of decoding elements 477.

In some cases, the decoding elements 477 may be examples of TFTs, and may be configured as vertical transistors (e.g., may have a vertical channel direction). For example, a decoding element 477 may include a transistor 445 having a first terminal 460-$a$ (e.g., a source terminal) and a second terminal 460-$b$ (e.g., a drain terminal), as well as a channel region 463. Additionally, a gate line 455 may be arranged adjacent to a channel region of a transistor 445 and may be configured to activate or deactivate the transistor 445 using a voltage applied to the gate line 455. Accordingly, the first portion 425 may be manufactured as part of manufacturing the memory array 410. That is, the memory array 410 and the first portion 425 may be included in a same first semiconductor device 435. For example, the first portion 425 may be formed over the memory array 410 by depositing one or more layers of material and patterning the first set of transistor 445 and the second set of transistors 445 to couple with the conductive pillars 420 and the word line plates 475, respectively.

In some cases, the digit lines 440 and the conductive lines 450 may be patterned above the first set of transistors 445 and the second set of transistors 445, respectively. For example, a digit line 440 may extend over a column of transistors 445 of the first set and may be selectively coupled with a corresponding column of conductive pillars 420 using the column of transistors 445. Additionally, a single conductive line 450 may extend over a column of transistors 445 of the second set and may selectively couple with a set of word line plates 475 using the column of transistors 445. In some cases, a conductive line 450 may selectively couple with word line plates 475 of multiple levels (e.g., a first transistor 445 may couple a first word line plate 475 of a first level with the conductive line 450, and a second transistor 445 may couple a second word line plate 475 of a second level with the conductive line 450).

In some examples, the set of digit lines 440, the set of conductive lines 450, and the set of gate lines 455 may each be coupled with a respective contact of a first set of contacts exposed on the surface of the first semiconductor device, each contact configured to drive the respective digit line 440, conductive line 450, or gate line 455 using circuitry included in the second portion 430 of the decoder 415. For example, the first set of contacts may be bonded or coupled with a second set of contacts 465 of the second portion 430, which may include circuitry configured to bias the second set of contacts 465.

In some cases, the second portion 430 may be an example of a second semiconductor device which includes one or more logic circuits formed within a semiconductor substrate 470, such as CMOS circuits. The semiconductor substrate may further include a set of transistors having terminals coupled with the second set of contacts.

In some cases, the second semiconducting device may be manufactured separately from the first semiconductor device 435. Accordingly, manufacturing the system 400 may include bonding or coupling the first semiconductor device 435 with the second semiconductor device (e.g., the second portion 430 of the decoder 415). For example, each contact 465 of the set of contacts may be bonded with a respective contact of the first set of contacts. That is, each contact 465 of the second portion 430 may be coupled with a digit line 440, a conductive line 450, or a gate line 455 through a respective contact of the first set of contacts. In some cases, such a technique of bonding the first semiconductor device 435 and the second semiconductor device may be referred to as hybrid bonding.

Figure 5:
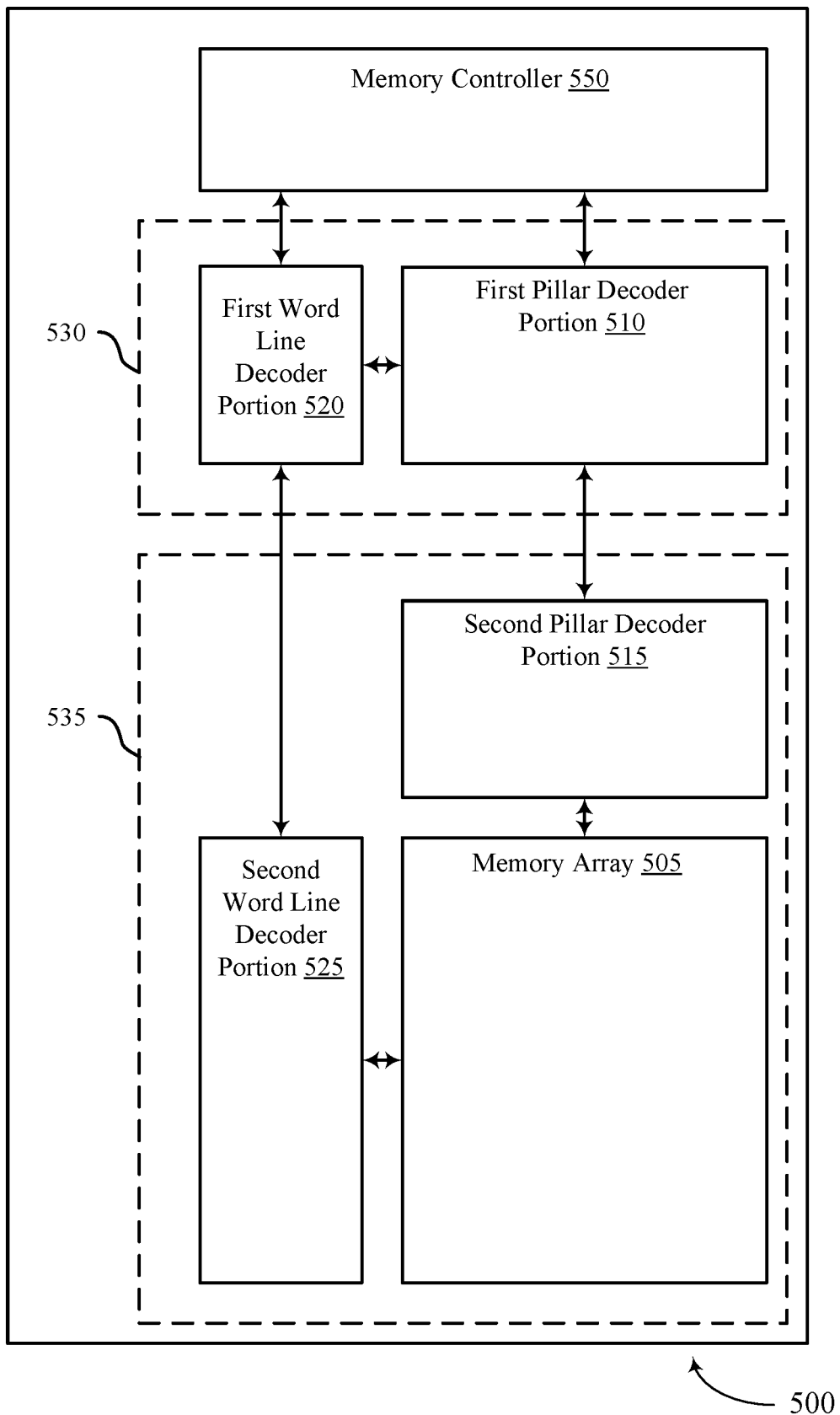
FIG. 5 illustrates an example of a system that supports decoder architectures for three-dimensional memory devices in accordance with examples as disclosed herein.

FIG. 5 illustrates an example of a memory system 500 that supports decoder architectures for three-dimensional memory devices in accordance with examples as disclosed herein. The memory system 500 may include a first semiconductor device 535 and a second semiconductor device 530. The semiconductor devices 530 and 535 may each be configured to operate according to instructions from a memory controller 550, which may be an example of a local memory controller 150 as described with reference to FIG. 1. Alternatively, the memory controller 550 may be located on the second semiconductor device 530.

The second semiconductor device 530 may be an example of a portion of a decoder (e.g., the decoder 415 as described with reference to FIG. 4) which includes a semiconductor substrate, such as a CMOS substrate, having one or more logic circuits and configured to drive signals independently to a set of contacts. The decoder may include a word line decoder to bias a word line of the memory array 505 and a pillar decoder to bias a conductive pillar of the memory array 505. Further, the word line decoder and the pillar decoder may each include a first portion and a second portion located in the second semiconductor device 530 and the first semiconductor device 535, respectively. In some cases, a first set of contacts of the second semiconductor device 530 may correspond to an output of a first portion of the word line decoder 520 and a second set of contacts of the second semiconductor device 530 may correspond to an output of a first portion of the pillar decoder 510. The first portion of the word line decoder 520 and the first portion of the pillar decoder 510 may drive signals to a second portion of the word line decoder 525 and a second portion of the pillar decoder 510, respectively, located in the first semiconductor device 535.

The first semiconductor device 535 may include a memory array 505, which may be an example of a three-dimensional memory array 200 as described with reference to FIG. 2. That is, the memory array 505 may include a vertical stack of word line plates (e.g., the word lines 205 as described with reference to FIGS. 3A and 3B, the word line plates 475 and word line members as described with reference to FIG. 4) having word line members extending into a memory region of the memory array 505. A word line plate of a level of the stack may include multiple interleaved comb structures (e.g., as depicted in FIG. 2), which may correspond to an even word line and an odd word line for the level. In some cases, a comb of the set of interleaved comb structures may include one or more isolated portions, which may reduce capacitance between a portion of the comb and other components of the memory array 505 (e.g., parasitic capacitance between the even and odd word lines, between separate levels of word lines, among other examples).

Additionally, the first semiconductor device 535 may include a set of conductive pillars extending vertically through the stack of word line plates and into the memory region (e.g., the conductive pillars 220, the conductive pillars 420 as described with reference to FIGS. 2 through 4). Each memory cell of the memory array 505 may be associated with a unique combination of a word line plate portion and a conductive pillar. Accordingly, to access a memory cell of the memory array 505, the memory controller may be configured to independently bias the word line portion and conductive pillar corresponding to the memory cell.

For example, to bias the conductive pillar, the memory controller 550 may transmit an instruction to the first portion of the pillar decoder 510 to drive a first signal and second signal to a first contact coupled with a gate line and a second contact coupled with a digit line of the second portion of the pillar decoder 515, respectively. Accordingly, the gate line may activate a decoding element arranged in the second portion of the pillar decoder 515, such as a vertical transistor or TFT, to couple the conductive pillar with the digit line to bias the conductive pillar using the second signal.

Additionally, to bias the word line portion, the memory controller 550 may transmit an instruction to the first portion of the word line decoder 520 to drive a first signal and second signal to a first contact coupled with a gate line and a second contact coupled with a conductive line of the second portion of the word line decoder 525, respectively. Accordingly, the gate line may activate a decoding element arranged in the second portion of the word line decoder 525, such as a vertical transistor or TFT, to couple the word line portion with the voltage source to bias the word line portion using the second signal. In some cases, the instruction transmitted to the first portion of the word line decoder 520 may include an indication of the level of the word line portion, as well as an indication of the word line portion. That is, to address a word line portion, the memory controller 550 may include an address of a level of the word line portion and an address of the word line portion within the level.

In some cases, each decoding element of the second portion of the word line decoder 525 may include a second vertical transistor which may selectively couple a word line portion with a second voltage source, such as a ground voltage source. In some cases, the first portion of the word line decoder 520 may include an additional set of contacts coupled with corresponding ones of the second voltage sources to drive signals to the second voltage sources. Accordingly, a first transistor of a decoding element may bias a word line portion to the voltage of the voltage source (e.g., to a supply voltage) and a second transistor of the decoding element may bias the word line portion to the voltage of the second voltage source (e.g., to ground). In some cases, the first portion of the word line decoder 520 and the second portion of the word line decoder 525 may be configured as a complete decoder for the word line plates (e.g., may activate a given word line plate based on a word line plate index).

Figure 6:
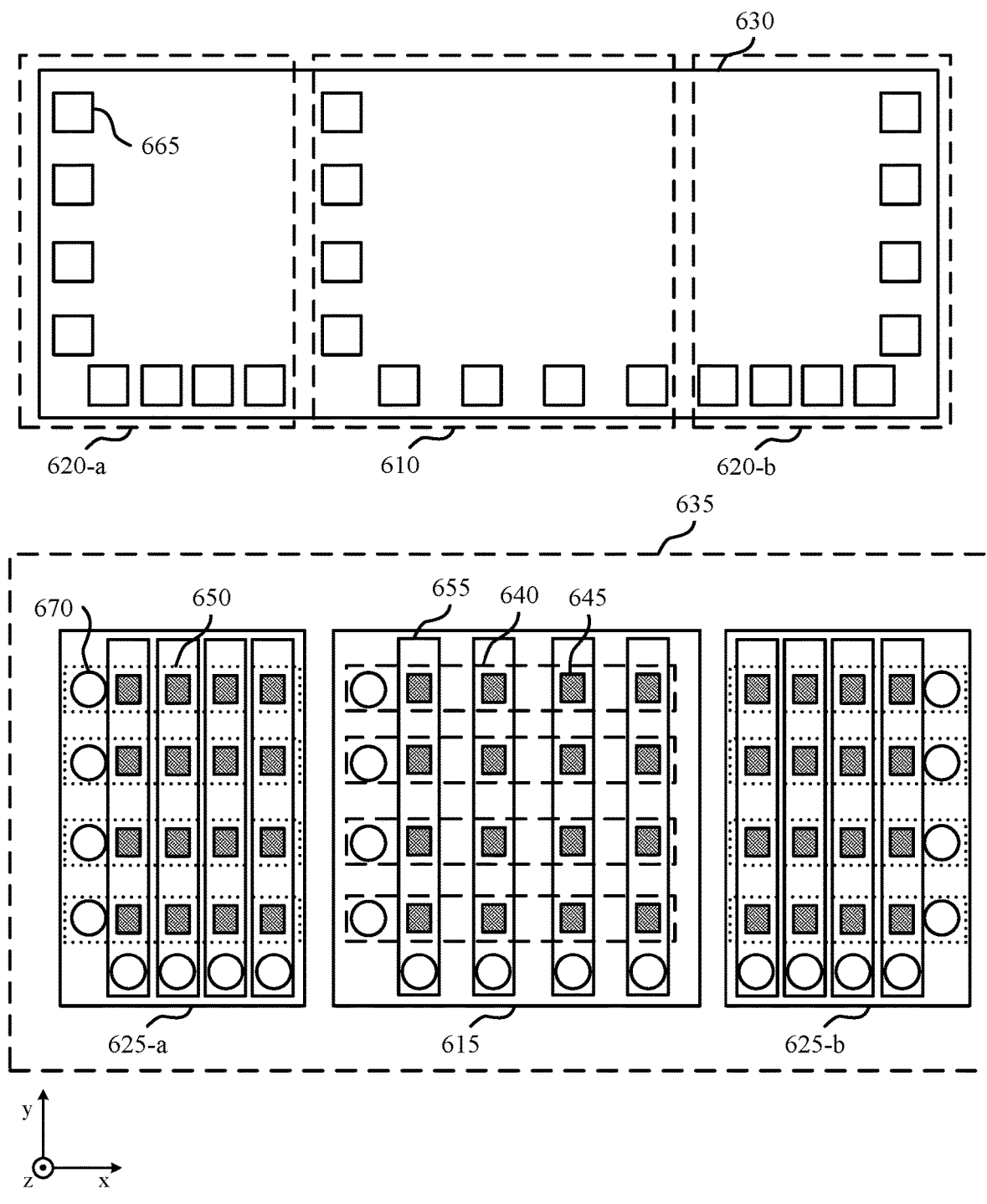
FIG. 6 illustrates an example of a system that supports decoder architectures for three-dimensional memory devices in accordance with examples as disclosed herein.

FIG. 6 illustrates an example of a system 600 that supports decoder architectures for three-dimensional memory devices in accordance with examples as disclosed herein. The system 600 may include a top down view of a cross section of a first semiconductor device 635 and a second semiconductor device 630. The first semiconductor device 635 may include aspects of or be an example of the first semiconductor device 435 or the first semiconductor device 535 as described with reference to FIGS. 4 and 5. The second semiconductor device 630 may include aspects of or be an example of the second semiconductor device 430 or the second semiconductor device 530 as described with reference to FIGS. 4 and 5.

For example, the first semiconductor device 635 may include a second portion of a decoder configured to access memory cells of a memory array of the first semiconductor device 635. In some cases, the second portion of the decoder may include a second pillar decoder portion 615 (e.g., the second portion of the pillar decoder 515, as described with reference to FIG. 5), which may include a set of digit lines 640 extending in the x-direction and a first set of transistors 645 arranged in one or more rows extending in the x-direction and one or more columns extending in the y-direction, the first set of transistors 645 configured to selectively couple respective conductive pillars of the memory array with a digit line 640 of the set of digit lines 640. Additionally, the second pillar decoder portion 615 may include a set of gate lines 655 extending in the y-direction configured to activate a column of transistors 645.

The first semiconductor device 635 may also include a second word line decoder portion 625-*a* (e.g., the second portion of the word line decoder 525, as described with reference to FIG. 5), which may include a set of conductive lines 650 extending in the x-direction and coupled with a voltage source and a second set of transistors 645 arranged in one or more rows extending in the x-direction and one or more columns extending in the y-direction, the second set of transistors 645 configured to selectively couple respective portions of word line plates of the memory array with a conductive line 650 of the set of conductive lines 650. Additionally, the second word line decoder portion 625-*a* may include a set of gate lines 655 extending in the y-direction configured to activate a column of transistors 645. In some cases, the first semiconductor device 635 may include an additional word line decoder portion 625-*b*. In such cases, the word line decoder portion 625-*a* may correspond to a first word line plate portion at each level of the memory array (e.g., an even word line), while the additional word line decoder portion 625-*b* may correspond to a second word line plate portion at each level of the memory array (e.g., an odd word line).

In order to drive signals to the word line plate portions and conductive pillars, the first semiconductor device may include a first set of contacts 670, each contact coupled with a respective contact of a second set of contacts 665 (e.g., the contacts 465 as described with reference to FIG. 4) of the second semiconductor device 630. The second semiconductor device 630 may include a first portion of the decoder configured to access memory cells of a memory array of the first semiconductor device 635. For example, the second semiconductor device 630 may include a first pillar decoder portion 610 (e.g., the first portion of the pillar decoder 510, as described with reference to FIG. 5), and a first word line decoder portion 620-*a* (e.g., the first portion of the word line decoder 520, as described with reference to FIG. 5). In some cases, the second semiconductor device 630 may include an additional word line decoder portion 620-*b*. Accordingly, the first word line decoder portion 620-*a* may correspond to the first word line plate portion at each level of the memory array (e.g., an even word line), while the additional word line decoder portion 620-*b* may correspond to the second word line plate portion at each level of the memory array (e.g., an odd word line).

In some cases, the first set of contacts 670 may be bonded with the second set of contacts 665. That is, each contact 670 of the first set of contacts may be coupled with a respective contact of the second set of contacts 665. For example, each contact 665 of the pillar decoder portion 610 may be coupled with a digit line 640 or a gate line 655 through a respective contact 670 of the second pillar decoder portion 615, while each contact 665 of the word line decoder portion 620-*a* may be coupled with a conductive line 650 or a gate line 655 through a respective contact 670 of the word line decoder portion 625-*a*. In some cases, such a technique of bonding the first semiconductor device 435 and the second semiconductor device may be referred to as hybrid bonding.

In some cases, the second set of contacts 665 may be arranged in one or more rows or one or more columns. For example, the pillar decoder portion 610 may include a row of contacts 665 bonded with a corresponding row of contacts 670 of the second pillar decoder portion 615. Accordingly, the row of contacts 665 may be configured to drive the gate lines 655 of the second pillar decoder portion 615. Similarly, the pillar decoder portion 610 may include a column of contacts 665 bonded with a corresponding column of contacts 670 of the second pillar decoder portion 615. Accordingly, the column of contacts 665 may be configured to drive the digit lines 640 of the second pillar decoder portion 615. However, one skilled in the art may appreciate that other configurations of the second set of contacts 665 are possible.

Due to the array structure of the transistors 645, to bias a conductive pillar or word line portion, a first signal may be driven to a gate line coupled with the transistor 645 associated with the conductive pillar or word line portion, and a second signal may be driven to a digit line 640 or voltage source coupled with the transistor 645. Accordingly, the gate line may activate the transistor to couple with conductive pillar with the digit line or to couple the word line portion with the voltage source, and thus drive the second signal to the conductive pillar or word line portion. Accordingly, the quantity of contacts used for each semiconductor may be less that the quantity of transistors 645. For example, if the second pillar decoding portion 615 includes 16 transistors 645, as depicted in FIG. 6, then the first pillar decoder portion 615 may include eight contacts 670 (e.g., four contacts 670 to drive each row and 4 contacts to drive each column). More generally, if the second pillar decoder portion 615 or the second word line decoder portion 625-*a* includes N rows of transistors 645 and M columns of transistors 645 (e.g., a total of N*M transistors 645), then the first pillar decoder portion 615 or the first word line decoder portion 625-*a* may include N+M contacts 670.

Figure 7:
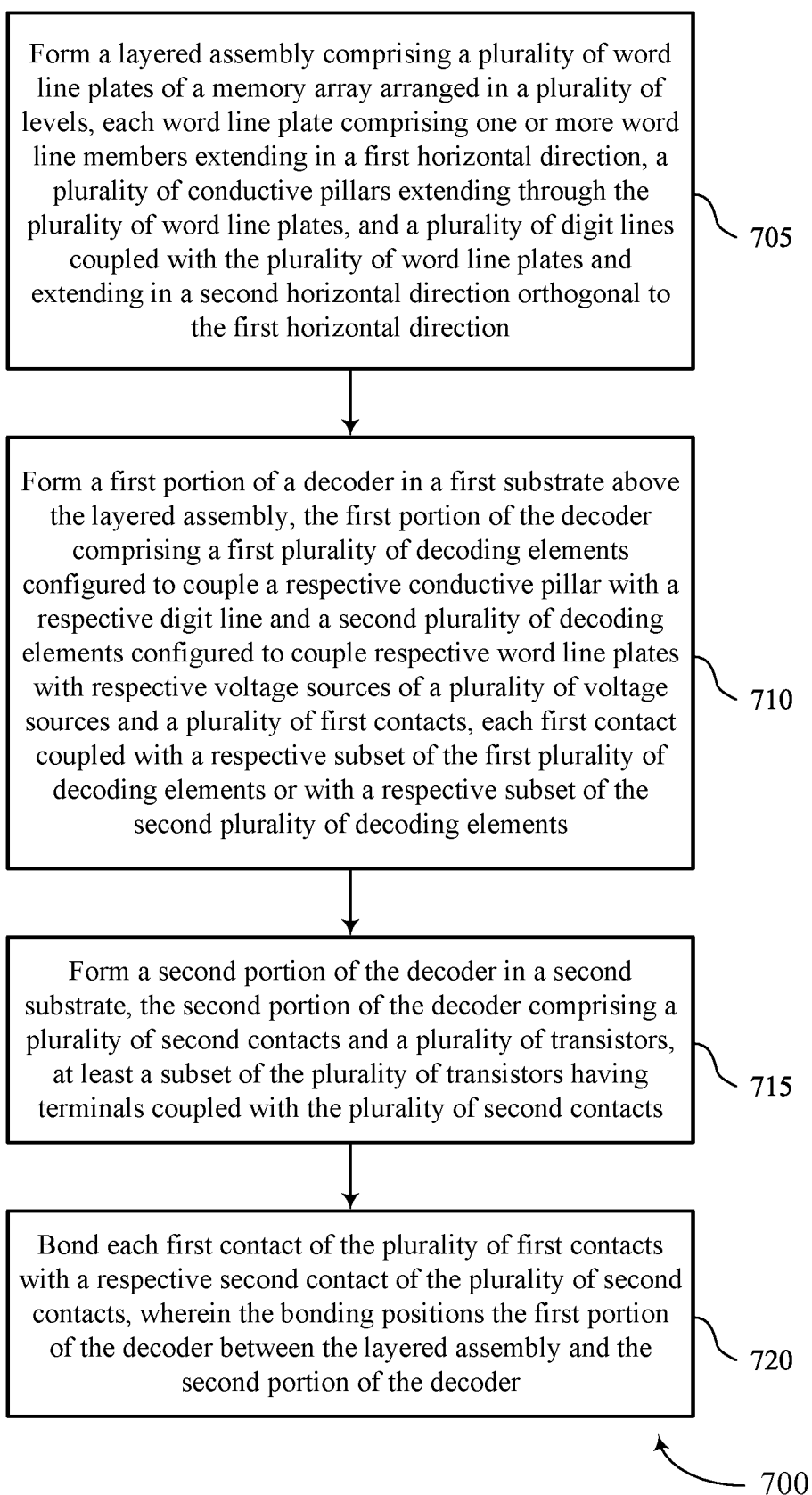
FIG. 7 shows a flowchart illustrating a method or methods that support decoder architectures for three-dimensional memory devices in accordance with examples as disclosed herein.

FIG. 7 shows a flowchart illustrating a method 700 that supports decoder architectures for three-dimensional memory devices in accordance with examples as disclosed herein. The operations of method 700 may be implemented by a process flow manager or its components as described herein. For example, the operations of method 700 may be performed by a process flow manager as described with reference to FIGS. 1 through 6. In some examples, a process flow manager may execute a set of instructions to control the functional elements of the device to perform the described functions. Additionally, or alternatively, the process flow manager may perform aspects of the described functions using special-purpose hardware.

At 705, the method may include forming a layered assembly including a plurality of word line plates of a memory array arranged in a plurality of levels, each word line plate including one or more word line members extending in a first horizontal direction, a plurality of conductive pillars extending through the plurality of word line plates, and a plurality of digit lines coupled with the plurality of word line plates and extending in a second horizontal direction orthogonal to the first horizontal direction. The operations of 705 may be performed in accordance with examples as disclosed herein. In some examples, aspects of the operations of 705 may be performed by an array formation component.

At 710, the method may include forming a first portion of a decoder in a first substrate above the layered assembly, the first portion of the decoder including a first plurality of decoding elements configured to couple a respective conductive pillar with a respective digit line and a second plurality of decoding elements configured to couple respective word line plates with respective voltage sources of a plurality of voltage sources and a plurality of first contacts, each first contact coupled with a respective subset of the first plurality of decoding elements or with a respective subset of the second plurality of decoding elements. The operations of 710 may be performed in accordance with examples as disclosed herein. In some examples, aspects of the operations of 710 may be performed by a first decoder formation component.

At 715, the method may include forming a second portion of the decoder in a second substrate, the second portion of the decoder including a plurality of second contacts and a plurality of transistors, at least a subset of the plurality of transistors having terminals coupled with the plurality of second contacts. The operations of 715 may be performed in accordance with examples as disclosed herein. In some examples, aspects of the operations of 715 may be performed by a second decoder formation component.

At 720, the method may include bonding each first contact of the plurality of first contacts with a respective second contact of the plurality of second contacts, where the bonding positions the first portion of the decoder between the layered assembly and the second portion of the decoder. The operations of 720 may be performed in accordance with examples as disclosed herein. In some examples, aspects of the operations of 720 may be performed by a decoder bonding component.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for forming a layered assembly including a plurality of word line plates of a memory array arranged in a plurality of levels, each word line plate including one or more word line members extending in a first horizontal direction, a plurality of conductive pillars extending through the plurality of word line plates, and a plurality of digit lines coupled with the plurality of word line plates and extending in a second horizontal direction orthogonal to the first horizontal direction; forming a first portion of a decoder in a first substrate above the layered assembly, the first portion of the decoder including a first plurality of decoding elements configured to couple a respective conductive pillar with a respective digit line and a second plurality of decoding elements configured to couple respective word line plates with respective voltage sources of a plurality of voltage sources and a plurality of first contacts, each first contact coupled with a respective subset of the first plurality of decoding elements or with a respective subset of the second plurality of decoding elements; forming a second portion of the decoder in a second substrate, the second portion of the decoder including a plurality of second contacts and a plurality of transistors, at least a subset of the plurality of transistors having terminals coupled with the plurality of second contacts; and bonding each first contact of the plurality of first contacts with a respective second contact of the plurality of second contacts, where the bonding positions the first portion of the decoder between the layered assembly and the second portion of the decoder.

Aspect 2: The method, apparatus, or non-transitory computer-readable medium of aspect 1 where forming the first portion of the decoder includes operations, features, circuitry, logic, means, or instructions, or any combination thereof for forming a respective first vertical transistor in each decoding element of the first plurality of decoding elements, the respective first vertical transistor including a first terminal coupled with a respective conductive pillar and a second terminal coupled with a respective digit line and forming a respective second vertical transistor in each decoding element of the second plurality of decoding elements, the respective second vertical transistor including a first terminal coupled with a respective word line portion and a second terminal coupled with a respective voltage source of the plurality of voltage sources.

Aspect 3: The method, apparatus, or non-transitory computer-readable medium of aspect 2 where forming the first portion of the decoder, further includes operations, features, circuitry, logic, means, or instructions, or any combination thereof for forming a first plurality of gate lines, each gate line of the first plurality coupled with a respective subset of the first vertical transistors and coupled with a respective first contact of the plurality of first contacts and forming a second plurality of gate lines, each gate line of the second plurality coupled with a respective subset of the second vertical transistors and coupled with a respective first contact of the plurality of first contacts.

Aspect 4: The method, apparatus, or non-transitory computer-readable medium of any of aspects 1 through 3 where the first plurality of decoding elements are arranged in a first grid structure including one or more rows extending in the first horizontal direction and one or more columns extending in the second horizontal direction orthogonal to the first horizontal direction; and the second plurality of decoding elements are arranged in a second grid structure including one or more rows extending in the first horizontal direction and one or more columns extending in the second horizontal direction.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 5: An apparatus, including: a first semiconductor device including a plurality of word line plates arranged in levels and a plurality of conductive pillars extending through the plurality of word line plates, the first semiconductor device including: a first plurality of vertical transistors, each vertical transistor of the first plurality selectively coupling a respective conductive pillar with a respective digit line of a plurality of digit lines; a second plurality of vertical transistors, each vertical transistor of the second plurality selectively coupling a respective word line plate with a respective voltage source of a plurality of voltage sources; and a plurality of first contacts, a first subset of the plurality of first contacts coupled with the first plurality of vertical transistors and a second subset of the plurality of first contacts coupled with the second plurality of vertical transistors; a second semiconductor device including one or more logic circuits formed within a semiconductor substrate of the second semiconductor device, the second semiconductor device including: a plurality of second contacts; and a third plurality of transistors, at least a subset of the third plurality of transistors having terminals coupled with the plurality of second contacts, the plurality of first contacts of the first semiconductor device bonded with the plurality of second contacts of the second semiconductor device.

Aspect 6: The apparatus of aspect 5, where the first semiconductor device further includes: a first plurality of gate lines, each gate line of the first plurality coupled with a respective subset of the first plurality of vertical transistors and coupled with a respective contact of the plurality of first contacts; and a second plurality of gate lines, each gate line of the second plurality coupled with a respective subset of the second plurality of vertical transistors and coupled with a respective contact of the plurality of first contacts.

Aspect 7: The apparatus of aspect 6, where each vertical transistor of the first plurality of vertical transistors includes a first terminal coupled with a respective conductive pillar of the plurality of conductive pillars, a second terminal coupled with a respective digit line of the plurality of digit lines, and a gate coupled with respective gate line of the first plurality of gate lines.

Aspect 8: The apparatus of any of aspects 6 through 7, where each vertical transistor of the second plurality of vertical transistors includes a first terminal coupled with a respective portion of a word line plate of the plurality of word line plates, a second terminal coupled with a respective voltage source of the plurality of voltage sources, and a gate coupled with respective gate line of the second plurality of gate lines.

Aspect 9: The apparatus of any of aspects 6 through 8, where the first semiconductor device further includes a third plurality of vertical transistors, each vertical transistor of the third plurality of vertical transistors selectively coupling a respective portion of a word line plate with a respective ground source.

Aspect 10: The apparatus of any of aspects 6 through 9, where each digit line of the plurality of digit lines is coupled with a respective contact of the plurality of first contacts and each voltage source of the plurality of voltage sources is coupled with a respective contact of the plurality of first contacts.

Aspect 11: The apparatus of any of aspects 6 through 10, where the first plurality of vertical transistors are arranged in a first grid structure including one or more rows extending in a first horizontal direction and one or more columns extending in a second horizontal direction orthogonal to the first horizontal direction; and the second plurality of vertical transistors are arranged in a second grid structure including one or more rows extending in the first horizontal direction and one or more columns extending in the second horizontal direction Aspect 12: The apparatus of aspect 11, where the plurality of first contacts includes a first row of contacts extending in the first horizontal direction, each first contact of the first row of contacts coupling a respective gate line of the first plurality of gate lines with a respective second contact of the plurality of second contacts, the plurality of first contacts further including a first column of contacts extending in the second horizontal direction, each first contact of the first column of contacts coupling a respective digit line of the plurality of digit lines with a respective second contact of the plurality of second contacts.

Aspect 13: The apparatus of aspect 12, where the plurality of first contacts further includes a second row of contacts extending in the first horizontal direction, each first contact of the second row of contacts coupling a respective gate line of the second plurality of gate lines with a respective second contact of the plurality of second contacts, the plurality of first contacts further including a second column of contacts extending in the second horizontal direction, each first contact of the second column of contacts coupling a respective voltage source of the plurality of voltage sources with a respective second contact of the plurality of second contacts.

Aspect 14: The apparatus of any of aspects 5 through 13, where a quantity of the plurality of first contacts is less than a sum of a quantity of the first plurality of vertical transistors and a quantity of the second plurality of vertical transistors.

Aspect 15: The apparatus of any of aspects 5 through 14, where each vertical transistor of the first plurality of vertical transistors and each transistor of the second plurality of vertical transistors includes a respective thin-film transistor (TFT).

An apparatus is described. The following provides an overview of aspects of the apparatus as described herein:

Aspect 16: An apparatus, including: a plurality of word line plates of a memory array arranged in a plurality of levels, each word line plate including one or more word line members extending in a first horizontal direction; a plurality of conductive pillars extending through the plurality of word line plates, where, at each word line plate of the plurality of levels, one or more memory cells of the memory array are coupled with a respective conductive pillar and a respective member of the word line plate; a plurality of digit lines extending in a second horizontal direction orthogonal to the first horizontal direction; and a decoder offset along a vertical direction from the plurality of levels and configured to bias the plurality of conductive pillars and the plurality of word line plates, the decoder including: a first portion including one or more logic circuits formed at least partially within a semiconductor substrate and associated with operating the memory array; and a second portion positioned between the first portion of the decoder and the memory array along the vertical direction, the second portion of the decoder including a first plurality of decoding elements configured to couple a respective conductive pillar with a respective digit line and a second plurality of decoding elements configured to couple a word line plate with a respective voltage source of a plurality of voltage sources.

Aspect 17: The apparatus of aspect 16, where the decoder further includes: a first plurality of gate lines, each gate line of the first plurality coupled with a respective subset of the first plurality of decoding elements and coupled with the one or more logic circuits using a respective contact of a first plurality of contacts coupling the first portion of the decoder with the second portion of the decoder; and a second plurality of gate lines, each gate line of the second plurality coupled with a respective subset of the second plurality of decoding elements and coupled with the one or more logic circuits using a respective contact of a second plurality of contacts coupling the first portion of the decoder with the second portion of the decoder.

Aspect 18: The apparatus of aspect 17, where each decoding element of the first plurality of decoding elements includes a respective vertical transistor having a first terminal coupled with a respective conductive pillar of the plurality of conductive pillars, a second terminal coupled with a respective digit line of the plurality of digit lines, and a gate coupled with respective gate line of the first plurality of gate lines.

Aspect 19: The apparatus of any of aspects 17 through 18, where each decoding element of the second plurality of decoding elements includes a respective vertical transistor having a first terminal coupled with a respective portion of a word line plate of the plurality of word line plates, a second terminal coupled with a respective voltage source of the plurality of voltage sources, and a gate coupled with respective gate line of the second plurality of gate lines.

Aspect 20: The apparatus of any of aspects 17 through 19, where each decoding element of the second plurality of decoding elements includes a respective first vertical transistor and a respective second vertical transistor, the respective first vertical transistor having a first terminal coupled with a respective portion of a word line plate of the plurality of word line plates, a second terminal coupled with a respective voltage source of the plurality of voltage sources, and a gate coupled with respective gate line of the second plurality of gate lines, and the respective second vertical transistor having a first terminal coupled with a respective portion of a word line plate of the plurality of word line plates, a second terminal coupled with a respective ground source, and a gate coupled with respective gate line of the second plurality of gate lines.

Aspect 21: The apparatus of any of aspects 17 through 20, where each digit line of the plurality of digit lines is coupled with a respective contact of the first plurality of contacts and each voltage source of the plurality of voltage sources is coupled with a respective contact of the second plurality of contacts.

Aspect 22: The apparatus of any of aspects 17 through 21, where: the first plurality of decoding elements are arranged in a first grid structure including one or more rows extending in the first horizontal direction and one or more columns extending in the second horizontal direction; and the second plurality of decoding elements are arranged in a second grid structure including one or more rows extending in the first horizontal direction and one or more columns extending in the second horizontal direction.

Aspect 23: The apparatus of aspect 22, where: the first plurality of contacts includes a row of contacts extending in the first horizontal direction, each contact of the row of contacts coupling a respective gate line of the first plurality of gate lines with the one or more logic circuits, the first plurality of contacts further including a column of contacts extending in the second horizontal direction, each contact of the column of contacts coupling a respective digit line of the plurality of digit lines with the one or more logic circuits; and the second plurality of contacts includes a row of contacts extending in the first horizontal direction, each contact of the row of contacts coupling a respective gate line of the second plurality of gate lines with the one or more logic circuits, the second plurality of contacts further including a column of contacts extending in the second horizontal direction, each contact of the column of contacts coupling a respective voltage source of the plurality of voltage sources with the one or more logic circuits.

Aspect 24: The apparatus of any of aspects 17 through 23, where a quantity of the first plurality of contacts is less than a quantity of the first plurality of decoding elements.

Aspect 25: The apparatus of any of aspects 17 through 24, where a quantity of the second plurality of contacts is less than a quantity of the second plurality of decoding elements.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication", "conductive contact", "connected", and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a first semiconductor device comprising a plurality of word line plates arranged in levels, a plurality of conductive pillars extending through the plurality of word line plates, and a first portion of a decoder, the first portion of the decoder comprising:
   a first plurality of vertical transistors, each vertical transistor of the first plurality of vertical transistors selectively coupling a respective conductive pillar with a respective digit line of a plurality of digit lines;
   a second plurality of vertical transistors, each vertical transistor of the second plurality of vertical transistors selectively coupling a respective word line plate with a respective voltage source of a plurality of voltage sources; and
   a plurality of first contacts, a first subset of the plurality of first contacts coupled with the first plurality of vertical transistors and a second subset of the plurality of first contacts coupled with the second plurality of vertical transistors; and
   a second semiconductor device comprising a second portion of the decoder, the second semiconductor device comprising one or more logic circuits formed within a semiconductor substrate of the second semiconductor device, the second portion of the decoder comprising:
   a plurality of second contacts; and
   a third plurality of transistors, at least a subset of the third plurality of transistors having terminals coupled with the plurality of second contacts, the plurality of first contacts of the first portion of the decoder bonded with the plurality of second contacts of the second portion of the decoder.

2. The apparatus of claim 1, wherein the first portion of the decoder further comprises:
   a first plurality of gate lines, each gate line of the first plurality of gate lines coupled with a respective subset of the first plurality of vertical transistors and coupled with a respective contact of the plurality of first contacts; and
   a second plurality of gate lines, each gate line of the second plurality of gate lines coupled with a respective subset of the second plurality of vertical transistors and coupled with a respective contact of the plurality of first contacts.

3. The apparatus of claim 2, wherein each vertical transistor of the first plurality of vertical transistors comprises a first terminal coupled with a respective conductive pillar of the plurality of conductive pillars, a second terminal coupled with a respective digit line of the plurality of digit lines, and a gate coupled with respective gate line of the first plurality of gate lines.

4. The apparatus of claim 2, wherein each vertical transistor of the second plurality of vertical transistors comprises a first terminal coupled with a respective portion of a word line plate of the plurality of word line plates, a second terminal coupled with a respective voltage source of the plurality of voltage sources, and a gate coupled with respective gate line of the second plurality of gate lines.

5. The apparatus of claim 2, wherein the first portion of the decoder further comprises a third plurality of vertical transistors, each vertical transistor of the third plurality of vertical transistors selectively coupling a respective portion of a word line plate with a respective ground source.

6. The apparatus of claim 2, wherein:
each digit line of the plurality of digit lines is coupled with a respective contact of the plurality of first contacts; and
each voltage source of the plurality of voltage sources is coupled with a respective contact of the plurality of first contacts.

7. The apparatus of claim 2, wherein:
the first plurality of vertical transistors are arranged in a first grid structure comprising one or more rows extending in a first horizontal direction and one or more columns extending in a second horizontal direction orthogonal to the first horizontal direction; and
the second plurality of vertical transistors are arranged in a second grid structure comprising one or more rows extending in the first horizontal direction and one or more columns extending in the second horizontal direction.

8. The apparatus of claim 7, wherein the plurality of first contacts comprises a first row of contacts extending in the first horizontal direction, each first contact of the first row of contacts coupling a respective gate line of the first plurality of gate lines with a respective second contact of the plurality of second contacts, the plurality of first contacts further comprising a first column of contacts extending in the second horizontal direction, each first contact of the first column of contacts coupling a respective digit line of the plurality of digit lines with a respective second contact of the plurality of second contacts.

9. The apparatus of claim 8, wherein the plurality of first contacts further comprises a second row of contacts extending in the first horizontal direction, each first contact of the second row of contacts coupling a respective gate line of the second plurality of gate lines with a respective second contact of the plurality of second contacts, the plurality of first contacts further comprising a second column of contacts extending in the second horizontal direction, each first contact of the second column of contacts coupling a respective voltage source of the plurality of voltage sources with a respective second contact of the plurality of second contacts.

10. The apparatus of claim 1, wherein a quantity of the plurality of first contacts is less than a sum of a quantity of the first plurality of vertical transistors and a quantity of the second plurality of vertical transistors.

11. The apparatus of claim 1, wherein each vertical transistor of the first plurality of vertical transistors and each transistor of the second plurality of vertical transistors comprises a respective thin-film transistor (TFT).

12. An apparatus, comprising:
a plurality of word line plates of a memory array arranged in a plurality of levels, each word line plate comprising one or more word line members extending in a first horizontal direction;
a plurality of conductive pillars extending through the plurality of word line plates, wherein, at each word line plate of the plurality of levels, one or more memory cells of the memory array are coupled with a respective conductive pillar and a respective member of the word line plate;
a plurality of digit lines extending in a second horizontal direction orthogonal to the first horizontal direction; and
a decoder offset along a vertical direction from the plurality of levels and configured to bias the plurality of conductive pillars and the plurality of word line plates, the decoder comprising a first portion associated with a first semiconductor device and a second portion associated with a second semiconductor device, wherein the first portion comprises a first plurality of contacts coupled to a second plurality of contacts of the second portion, the decoder comprising:
the first portion comprising one or more logic circuits formed at least partially within a semiconductor substrate and associated with operating the memory array; and
the second portion positioned between the first portion of the decoder and the memory array along the vertical direction, the second portion of the decoder comprising a first plurality of decoding elements configured to couple a respective conductive pillar with a respective digit line and a second plurality of decoding elements configured to couple a word line plate with a respective voltage source of a plurality of voltage sources.

13. The apparatus of claim 12, wherein the decoder further comprises:
a first plurality of gate lines, each gate line of the first plurality of gate lines coupled with a respective subset of the first plurality of decoding elements and coupled with the one or more logic circuits using a respective contact of the first plurality of contacts coupling the first portion of the decoder with the second portion of the decoder; and
a second plurality of gate lines, each gate line of the second plurality of gate lines coupled with a respective subset of the second plurality of decoding elements and coupled with the one or more logic circuits using a respective contact of the second plurality of contacts coupling the first portion of the decoder with the second portion of the decoder.

14. The apparatus of claim 13, wherein each decoding element of the first plurality of decoding elements comprises a respective vertical transistor having a first terminal coupled with a respective conductive pillar of the plurality of conductive pillars, a second terminal coupled with a respective digit line of the plurality of digit lines, and a gate coupled with respective gate line of the first plurality of gate lines.

15. The apparatus of claim 13, wherein each decoding element of the second plurality of decoding elements comprises a respective vertical transistor having a first terminal coupled with a respective portion of a word line plate of the plurality of word line plates, a second terminal coupled with a respective voltage source of the plurality of voltage sources, and a gate coupled with respective gate line of the second plurality of gate lines.

16. The apparatus of claim 13, wherein each decoding element of the second plurality of decoding elements comprises a respective first vertical transistor and a respective second vertical transistor, the respective first vertical transistor having a first terminal coupled with a respective portion of a word line plate of the plurality of word line plates, a second terminal coupled with a respective voltage source of the plurality of voltage sources, and a gate coupled with respective gate line of the second plurality of gate lines, and the respective second vertical transistor having a first terminal coupled with a respective portion of a word line plate of the plurality of word line plates, a second terminal coupled with a respective ground source, and a gate coupled with respective gate line of the second plurality of gate lines.

17. The apparatus of claim 13, wherein:
each digit line of the plurality of digit lines is coupled with a respective contact of the first plurality of contacts; and
each voltage source of the plurality of voltage sources is coupled with a respective contact of the second plurality of contacts.

18. The apparatus of claim 13, wherein:
the first plurality of decoding elements are arranged in a first grid structure comprising one or more rows extending in the first horizontal direction and one or more columns extending in the second horizontal direction; and
the second plurality of decoding elements are arranged in a second grid structure comprising one or more rows extending in the first horizontal direction and one or more columns extending in the second horizontal direction.

19. The apparatus of claim 18, wherein:
the first plurality of contacts comprises a row of contacts extending in the first horizontal direction, each contact of the row of contacts coupling a respective gate line of the first plurality of gate lines with the one or more logic circuits, the first plurality of contacts further comprising a column of contacts extending in the second horizontal direction, each contact of the column of contacts coupling a respective digit line of the plurality of digit lines with the one or more logic circuits; and
the second plurality of contacts comprises a row of contacts extending in the first horizontal direction, each contact of the row of contacts coupling a respective gate line of the second plurality of gate lines with the one or more logic circuits, the second plurality of contacts further comprising a column of contacts extending in the second horizontal direction, each contact of the column of contacts coupling a respective voltage source of the plurality of voltage sources with the one or more logic circuits.

20. The apparatus of claim 13, wherein a quantity of the first plurality of contacts is less than a quantity of the first plurality of decoding elements.

21. The apparatus of claim 13, wherein a quantity of the second plurality of contacts is less than a quantity of the second plurality of decoding elements.

22. A method, comprising:
forming a layered assembly comprising a plurality of word line plates of a memory array arranged in a plurality of levels, each word line plate comprising one or more word line members extending in a first horizontal direction, a plurality of conductive pillars extending through the plurality of word line plates, and a plurality of digit lines coupled with the plurality of word line plates and extending in a second horizontal direction orthogonal to the first horizontal direction;
forming a first portion of a decoder in a first substrate above the layered assembly, the first portion of the decoder comprising a first plurality of decoding elements configured to couple a respective conductive pillar with a respective digit line and a second plurality of decoding elements configured to couple respective word line plates with respective voltage sources of a plurality of voltage sources and a plurality of first contacts, each first contact coupled with a respective subset of the first plurality of decoding elements or with a respective subset of the second plurality of decoding elements;
forming a second portion of the decoder in a second substrate, the second portion of the decoder comprising a plurality of second contacts and a plurality of transistors, at least a subset of the plurality of transistors having terminals coupled with the plurality of second contacts; and
bonding each first contact of the plurality of first contacts with a respective second contact of the plurality of second contacts, wherein the bonding positions the first portion of the decoder between the layered assembly and the second portion of the decoder.

23. The method of claim 22, wherein forming the first portion of the decoder comprises:
forming a respective first vertical transistor in each decoding elements of the first plurality of decoding elements, the respective first vertical transistor comprising a first terminal coupled with a respective conductive pillar and a second terminal coupled with a respective digit line; and
forming a respective second vertical transistor in each decoding elements of the second plurality of decoding elements, the respective second vertical transistor comprising a first terminal coupled with a respective word line portion and a second terminal coupled with a respective voltage source of the plurality of voltage sources.

24. The method of claim 23, wherein forming the first portion of the decoder further comprises:
forming a first plurality of gate lines, each gate line of the first plurality of gate lines coupled with a respective subset of the first vertical transistors and coupled with a respective first contact of the plurality of first contacts; and
forming a second plurality of gate lines, each gate line of the second plurality of gate lines coupled with a respective subset of the second vertical transistors and coupled with a respective first contact of the plurality of first contacts.

25. The method of claim 22, wherein the first plurality of decoding elements are arranged in a first grid structure comprising one or more rows extending in the first horizontal direction and one or more columns extending in the second horizontal direction orthogonal to the first horizontal direction; and the second plurality of decoding elements are arranged in a second grid structure comprising one or more rows extending in the first horizontal direction and one or more columns extending in the second horizontal direction.

* * * * *